(12) United States Patent
Murakami et al.

(10) Patent No.: US 12,191,979 B2
(45) Date of Patent: Jan. 7, 2025

(54) RADIO WAVE MONITORING APPARATUS

(71) Applicant: Sony Semiconductor Solutions Corporation, Kanagawa (JP)

(72) Inventors: Tomomichi Murakami, Kanagawa (JP); Bruce Michael Lachlan, Kanagawa (JP); Hiroyuki Shimizu, Kanagawa (JP); Hiroshi Shono, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 131 days.

(21) Appl. No.: 17/787,613

(22) PCT Filed: Nov. 19, 2020

(86) PCT No.: PCT/JP2020/043196
§ 371 (c)(1),
(2) Date: Jun. 21, 2022

(87) PCT Pub. No.: WO2021/131438
PCT Pub. Date: Jul. 1, 2021

(65) Prior Publication Data
US 2022/0416924 A1   Dec. 29, 2022

(30) Foreign Application Priority Data
Dec. 25, 2019   (JP) ................. 2019-234877

(51) Int. Cl.
*H04H 60/29*   (2008.01)
*H04B 17/309*   (2015.01)

(52) U.S. Cl.
CPC ........... *H04H 60/29* (2013.01); *H04B 17/309* (2015.01)

(58) Field of Classification Search
None
See application file for complete search history.

(56) References Cited

U.S. PATENT DOCUMENTS

2006/0075450 A1\* 4/2006 Haas ................ H04N 7/18
725/121
2022/0303331 A1\* 9/2022 Svennebring .... H04N 21/44209

FOREIGN PATENT DOCUMENTS

| JP | H09-307131 A | 11/1997 |
| JP | 2001-144654 A | 5/2001 |
| JP | 2006-067000 A | 3/2006 |
| JP | 2008072527 A | 3/2008 |

OTHER PUBLICATIONS

International Search Report issued in International Patent Application No. PCT/JP2020/043196 on Feb. 9, 2021 and English translation of same. 8 pages.

(Continued)

*Primary Examiner* — Omar S Parra
(74) *Attorney, Agent, or Firm* — K&L Gates LLP

(57) ABSTRACT

A radio wave monitoring apparatus includes a television receiver which is capable of receiving a radio wave in a television broadcast frequency band and generates reception quality information, and a wireless communication device which is capable of establishing communication in an area to be monitored and a wider area than the area to be monitored and transmits the reception quality information.

18 Claims, 14 Drawing Sheets

(56) References Cited

OTHER PUBLICATIONS

Written Opinion issued in International Patent Application No. PCT/JP2020/043196 on Feb. 9, 2021. 5 pages.
Abe, Toru et al., "Development of a Monitoring System for Digital Terrestrial TV waves," ITE technical report, Oct. 24, 2003, vol. 27, No. 62, pp. 5-8, in particular, chapter 3.
Matsumura, Takeshi, et al., "Empirical Throughput Evaluation for IEEE 802.11af Channel Aggregation", IEICE Technical Report, May 23, 2019, vol. 119, No. 62, pp. 91-95. <URL:https://www.ieice.org/ken/paper/20190531Q1Ni/>, in particular, chapter 1.
Internet <URL:https://web.archive.org/web/20120804012112/http://www.soumu.go.jp/soutsu/kanto/re/info/huhou/huhou.pdf>, Aug. 4, 2012, in particular, p. 4, non-official translation Ministry of Internal Affairs and Communications, "Characteristics of illegal radio stations, effects, and cases of disorder."
URL:https://www.meidensha.co.jp/news/news_03/news_03_01/1222755_2469.html>, Jan. 17, 2017, in particular, text, Meidensha Corporation, "Meidensha to Embark on Demonstration Experiment of LPWA Network-based Disaster Prevention Monitoring Service."
<URL:https://www.nikkei.com/article/DGXLRSP510580_Y9A520CI000000/><URL:https://release.nikkei.co.jp/attach_file/0510580_02.pdf>, May 28, 2019, in particular, text, The figure records in the attached release, non-official translation Nikkei, Inc., "Sony commercializes communication module 'CXM1501GR'."
<URL:https://www.meidensha.co.jp/rd/rd_01/rd_01_02 /rd_01_02_21/rd_01_02_17_01/icsFiles/afieldfile/2019/10/11/No365_04_web_191007.pdf>, 2019, No. 4, serial No. 365, Meidensha Corporation, 2019, pp. 6-9, in particular, chapters 3-5, non-official translation (Hideshima, Hiroto et al., "Development of information communication terminals compatible with LPWA (Low Power Wide Area)", Meiden Review.

* cited by examiner

F I G. 7
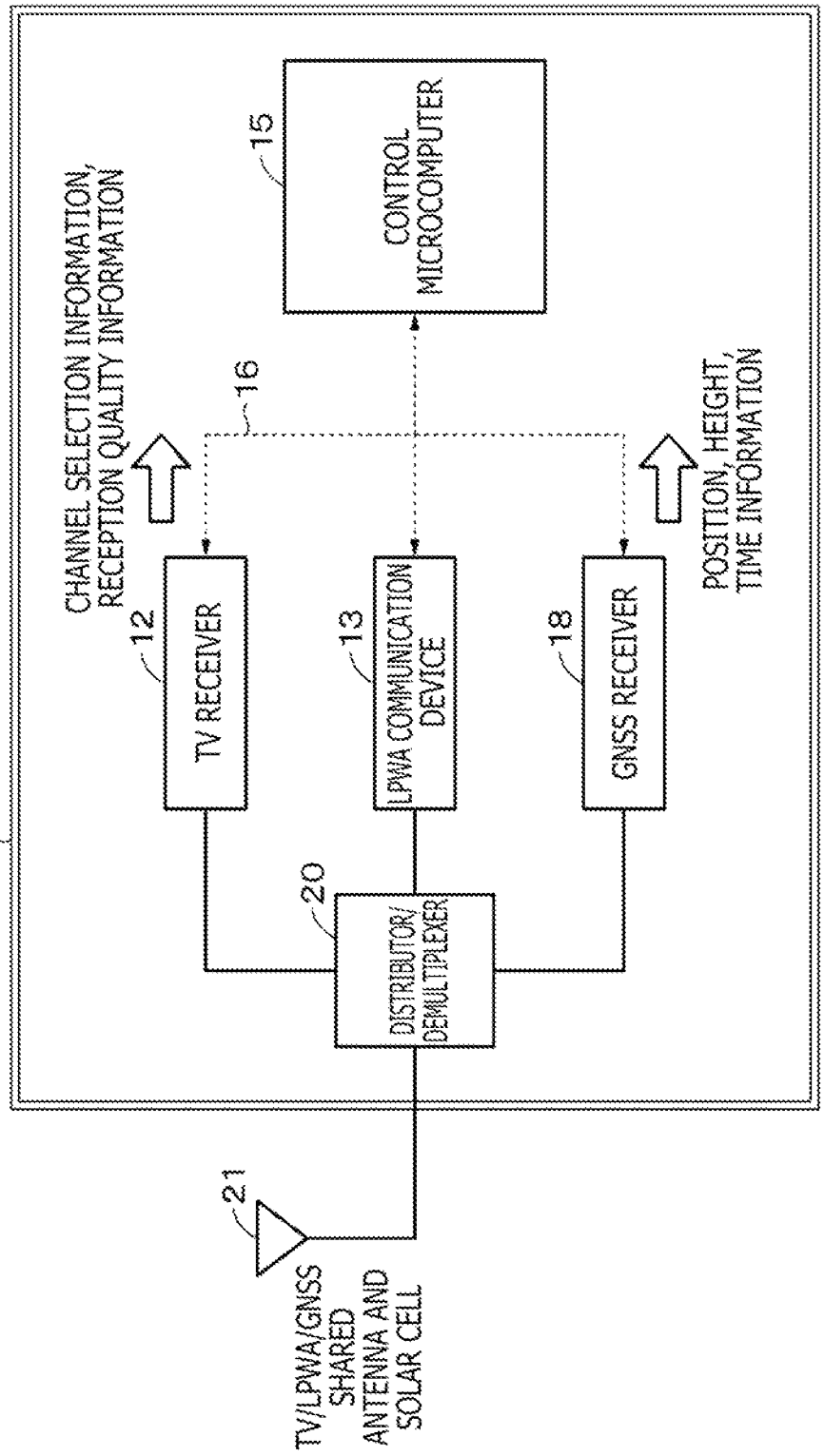

RADIO WAVE MONITORING APPARATUS

TECHNICAL FIELD

The present technology relates to a radio wave monitoring apparatus applied, for example, to television broadcast radio waves.

BACKGROUND ART

For example, in digital television broadcasting, the quality of a reception signal varies greatly by an influence of land features, buildings, weather, and the like. Therefore, by providing many radio wave monitoring apparatus such that information is received from the radio wave monitoring apparatuses, it is possible to increase the accuracy in monitoring in a reception area or to map reception quality information on a map.

Conventionally, such a reception monitoring system for terrestrial digital broadcasting as disclosed in PTL 1 has been proposed. This system includes a transmission station for transmitting digital data and a reception station for monitoring. A BER (Bit Error Rate) received at the reception station is processed by a data collection terminal, and data of a result of the processing is returned to the transmission station by use of a modem. Then, if an abnormality is found, then the transmission output is switched.

Further, another PTL 2 has been proposed. What is disclosed in PTL 2 is means for configuring an SFN (Single Frequency Network). Although the SFN is introduced in order to increase the frequency usage efficiency and is a technique for the transmission from a plurality of transmission stations at a same frequency, it is restricted in that the displacement between two signals in a reception area must be restricted within a guard interval. Therefore, PTL 2 is a patent of a system that includes a plurality of broadcasting stations and a monitoring apparatus for a reception level and configures an SFN that is optimum as a whole by adjusting output levels of the plurality of transmission stations on the basis of the reception state at the monitoring apparatus and providing identification processing means for a transmission source.

CITATION LIST

Patent Literature

[PTL 1]
   JP 2001-144654A
[PTL 2]
   JP 2008-072527A

SUMMARY

Technical Problem

Since the modem disclosed in PTL 1 is a device that transfers data by use of a wired telephone line, in order to communicate between a transmission station and a reception station, it is necessary to lay a telephone line, and the reception station can be installed only at a place at which the telephone line is available. Therefore, the location of the reception station is restricted. Further, there is a problem that the radio wave monitoring terminal cannot be carried.

The present technology is a method for communicating between a transmission station and a reception station by use of LPWA (Low Power Wide Area) communication. Since this method uses wireless communication and is long in communication distance and low in power consumption, it allows communication without restricting the installation place of the reception station. Further, since the method is low in power, a battery can be used to continue observation for a long period of time at a fixed point, and the monitoring cost decreases significantly.

PTL 2 is restricted to a technique for constructing an SFN. Further, PTL 2 does not recite what communication method is used to transfer data between a transmission station and a reception station.

In construct, the present technology is not restricted to construction of an SFN, and the present technology makes it possible to sense a network problem quickly and decrease the support cost by monitoring a network on a real-time basis with use of LPWA communication. Further, although the field intensity that reaches the reception side changes when the weather condition changes by rain or the like, by monitoring the field intensity and dynamically changing the transmission level, enhancement of the broadcasting network quality and reduction of the cost resulting from reduction of the power consumption can be achieved.

Accordingly, it is an object of the present technology to provide a radio wave monitoring apparatus that can reduce restrictions to the installation place and restrictions for continuous monitoring in monitoring of radio waves.

Solution to Problem

The present technology is a radio wave monitoring apparatus including a television receiver which is capable of receiving a radio wave in a television broadcast frequency band and generates reception quality information, and a wireless communication device which is capable of establishing communication in an area to be monitored and a wider area than the area to be monitored and transmits the reception quality information.

BRIEF DESCRIPTION OF DRAWINGS

FIG. 7 is a block diagram of a modification of the third example of the radio wave monitoring apparatus according to the present technology.

DESCRIPTION OF EMBODIMENTS

Embodiments described below are preferred particular examples of the present technology and have various restrictions, which are technically preferable, added thereto. However, the scope of the present technology is not restricted by the embodiments unless it is particularly described in the following description that the present technology is restricted.

Figure 1:
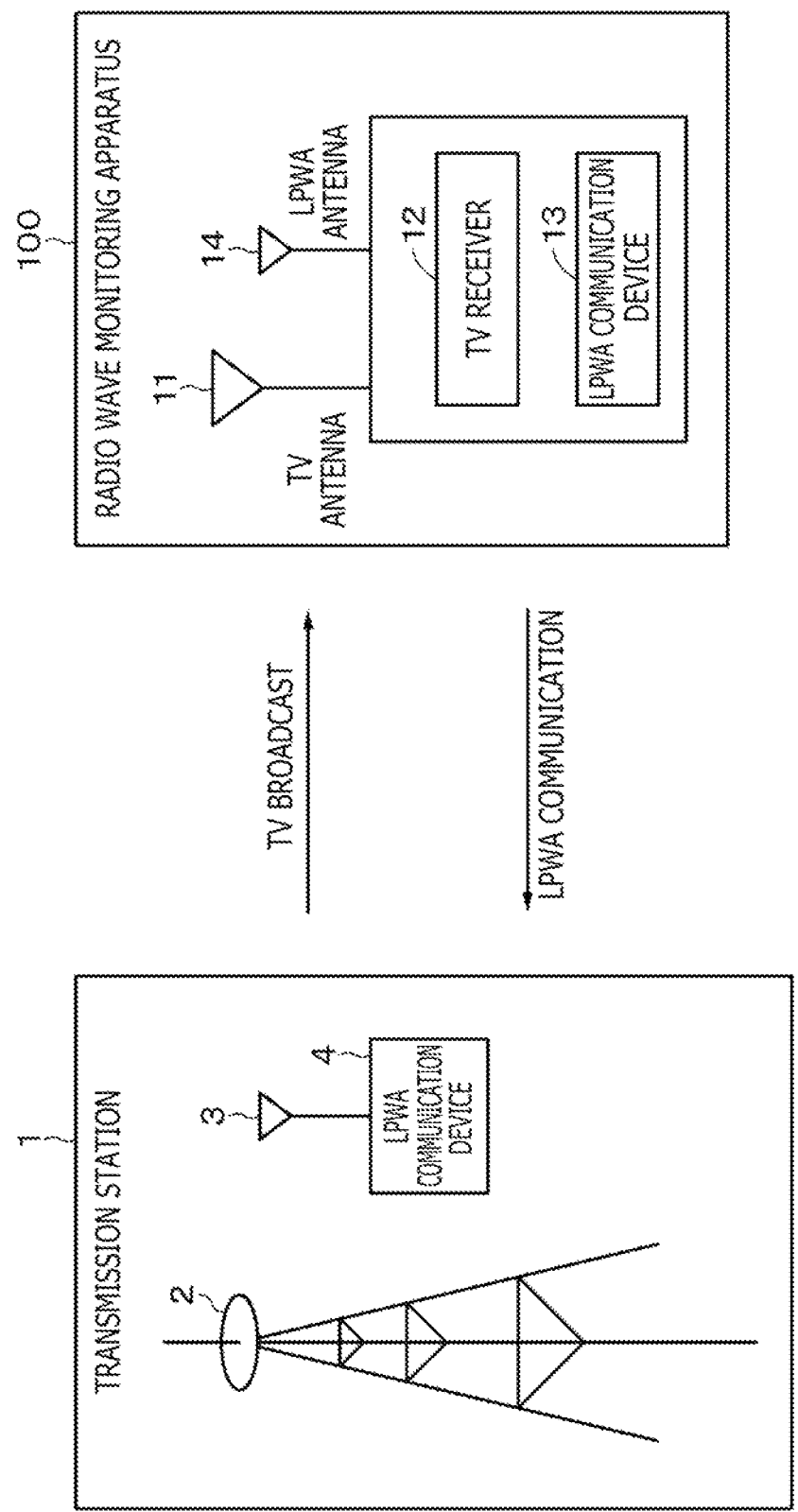
FIG. 1 is a block diagram of an example of a radio wave monitoring system according to the present technology.

FIG. 1 illustrates an example of a radio wave monitoring system that utilizes the radio wave monitoring apparatus according to the present technology. A television radio wave is transmitted from a transmission antenna 2 of a transmission station 1, and the television radio wave is received by a television antenna 11 of a radio wave monitoring apparatus 100. The radio wave monitoring apparatus 100 includes a television receiver 12 and an LPWA communication device 13.

The radio wave monitoring apparatus 100 monitors the quality of a reception signal of the television receiver 12 and acquires an index representative of the reception quality (referred to as reception quality information). The reception quality information is acquired on the real time basis for each reception frequency (reception channel). As the reception quality information, for example, such information as described below can be used.

In particular, as the reception quality information, information regarding the RSSI (Received Signal Strength Indicator), the CNR (Carrier to Noise Ratio), the BER (Bit Error Rate), the PER (Packet Error Rate), the FER (Frame Error Rate), an iteration number of the LDPC in the case of LDPC coding, Lock/Unlock, a frequency response, phase noise, a delay profile, or the like can be used. In a case where a plurality of reception antennae exists, each antenna has the reception quality information. Further, since reception algorithm may sometimes differ depending on a version of software or firmware of the receiver, the reception quality information includes version information of the software or firmware of the receiver or information regarding whether or not update has been performed successfully. The reception quality information is transmitted from an LPWA antenna 14 to the transmission station 1. The reception quality information is received by an LPWA antenna 3 of the transmission station 1. The LPWA antenna 3 is provided on an LPWA communication device 4. The transmission station 1 is configured to take such a countermeasure as to represent the received reception quality information as a map or investigate a cause of low reception quality.

Also, a working example is available in which the radio wave monitoring apparatus 100 is a mobile station (such as an in-vehicle station). At this time, a plurality of television antennae 11 is sometimes provided, so that a television radio wave can be received by synthesizing signal processing.

In a case where the radio wave monitoring apparatus is a mobile station, there is a merit that the radio wave monitoring apparatus can monitor many places in a short period of time.

Figure 2:
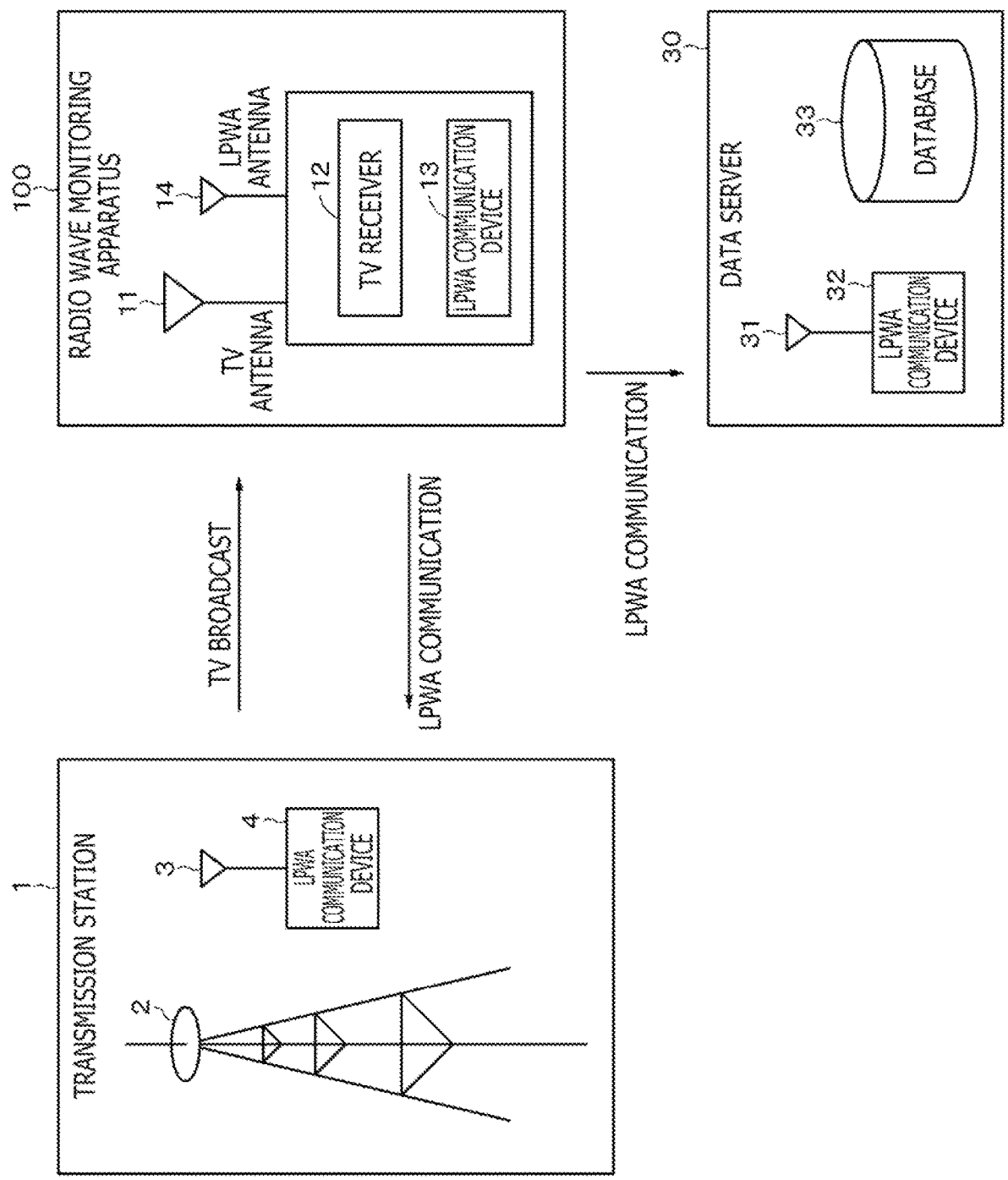
FIG. 2 is a block diagram of another example of the radio wave monitoring system according to the present technology.

FIG. 2 illustrates another example of the radio wave monitoring system. The radio wave monitoring apparatus 100 transmits reception quality information to the transmission station 1 and further transmits the reception quality information to an LPWA antenna 31 (LPWA communication device 32) of a data server 30 such that the reception quality information is accumulated into a database 33. This makes it easy to process and utilize the reception quality information accumulated in the database 33 at not only the transmission station 1, but also the data server 30.

In the present technology, LPWA communication is used to monitor the reception quality on the real time basis. Since this method utilizes wireless communication and is long in communication distance and low in power consumption, communication can be performed without giving any restriction to the installation place of a reception station. Further, since LPWA communication is low in electric power, it is possible to continue observation for a long period of time at a fixed point by use of a battery, and the monitoring cost decreases significantly. Also, mobile communication is possible as well. Further, although the field intensity that reaches the reception side changes when the weather condition changes by rain or the like, if the field intensity is monitored, the transmission level, a transmission parameter, and the like are dynamically changed, so that it is possible to achieve improvement in broadcasting network quality and cost reduction resulting from reduction of the labor costs and the power consumption.

Figure 3:
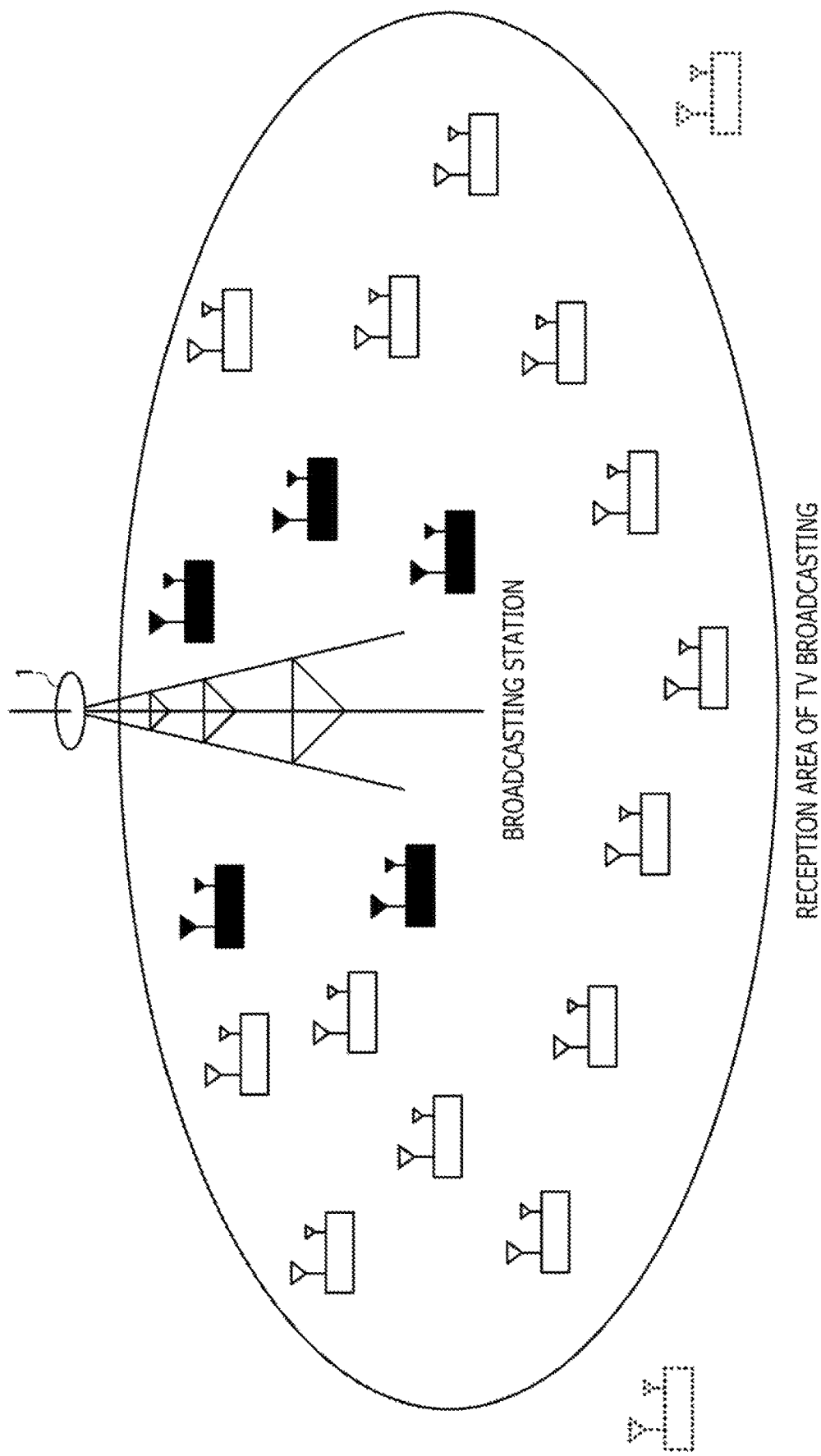
FIG. 3 is a schematic diagram depicting arrangement of a large number of radio wave monitoring apparatuses in a radio wave monitoring system.

As depicted in FIG. 3, a radio wave monitoring system can be configured by installing many radio wave monitoring apparatuses around the transmission station 1. Each radio wave monitoring apparatus can be identified with its own ID. Further, as hereinafter described, by receiving position information of the radio wave monitoring apparatus, mapping can be carried out. A radio wave monitoring apparatus indicated by a filled pattern is a radio wave monitoring apparatus from which reception quality information indicating that the reception quality is highest has been transmitted, while a radio wave monitoring apparatus indicated by an unfilled pattern is a radio wave monitoring apparatus from which reception quality information representing that the reception quality is average has been transmitted, and a radio wave monitoring apparatus indicated by a broken line is a radio wave monitoring apparatus from which reception quality information representing that the reception quality is low has been transmitted. In this manner, since a great number of radio wave monitoring apparatuses can be arranged in a reception area, the monitoring accuracy is enhanced significantly, and it also becomes possible to map signal quality situations on a map. Further, since the communication range of an LPWA communication device is similar to or greater than that of the reception area of a television broadcast, information that the television broadcast cannot be received can be transmitted.

As a method of the LPWA communication, for example, ELTRES (registered trademark) can be used. Specifications of this LPWA communication method in Japan are indicted blow. With the present technology, it is also possible to use an LPWA communication method other than ELTRES (registered trademark).

Antenna power: 20 mW
Communication direction: unidirectional communication
Transmission frequency: 923.6 MHz to 928.0 MHz (920 MHz band)
Communication speed: 6.35 kpbs
In present situation, reception quality data is transmitted once for one minute Time interval is variable Long-distance communication is possible (transmission performance over 100 km or more in line-of-sight distance)

GNSS reception function is incorporated

It is to be noted that the receivable frequency range of the television receiver 12 is 42 MHz to 3300 MHz. Moreover, frequency division or the like is applied to prevent interference of transmission signals of a plurality of radio wave monitoring apparatuses with each other.

Figure 4:
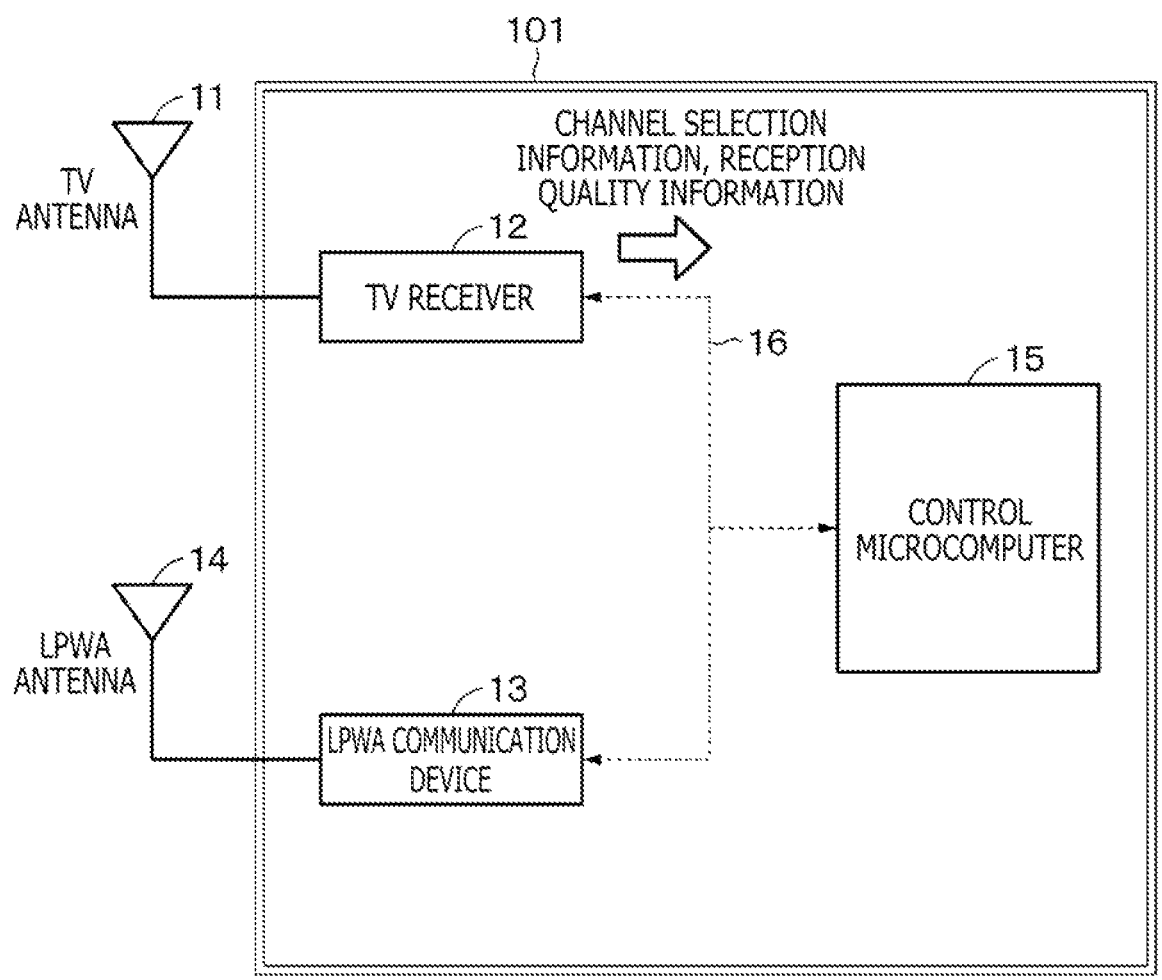
FIG. 4 is a block diagram of a first example of the radio wave monitoring apparatus according to the present technology.

In the following, a plurality of embodiments of the radio wave monitoring apparatus is described. In the radio wave monitoring apparatus 101 depicted in FIG. 4, a television receiver 12 to which a television antenna 11 is connected and an LPWA communication device 13 to which an LPWA antenna 14 is connected are connected to a bus 16 of a control microcomputer (hereinafter referred to as a control microcomputer) 15. The control microcomputer 15 transmits and receives data to and from the television receiver 12 and the LPWA communication device 13 through the bus 16 and controls operation of the overall radio wave monitoring apparatus 101.

Channel selection information and reception quality information obtained as a result of reception via the television antenna 11 are supplied to the control microcomputer 15, and the reception quality information is transmitted to a transmission station or a data server by the LPWA communication device 13 and the LPWA antenna 14 under the control of the control microcomputer 15.

According to the radio wave monitoring apparatus 101, the following advantageous effects are obtained.

Real time monitoring of a broadcasting network becomes possible, and a problem that occurs in the broadcasting network can be detected quickly. For example, abnormality of a radio wave transmission-reception environment by a natural disaster (torrential rain, typhoon, gust, or the like) and time, place, and influence of an illegal radio wave can be identified on the real time basis. Further, a fringe area in a broadcasting area can be monitored. Furthermore, since a person need not perform a measurement work, the support cost can be reduced.

A transmission station that receives reception quality information from the radio wave monitoring apparatus 101 dynamically changes the transmission power and a transmission parameter on the basis of the reception quality information. For example, by changing the transmission level and a transmission parameter (for example, code rate) depending on a weather condition, improvement in broadcasting network quality and cost reduction resulting from reduction of the labor costs and the power consumption can be achieved. Further, when the radio wave transmission-reception environment is abnormal, the transmission station performs a countermeasure of temporarily increasing the transmission power at a specific place or changing a parameter to a robust parameter.

As for the reception quality information, not only a worker on the transmission station side, but also by a person who carries a communication terminal such as a smartphone can access information at the transmission station or in the data server on the real time basis to acquire reception quality information. Consequently, improvement in broadcasting network quality and cost reduction can be achieved.

Figure 5:
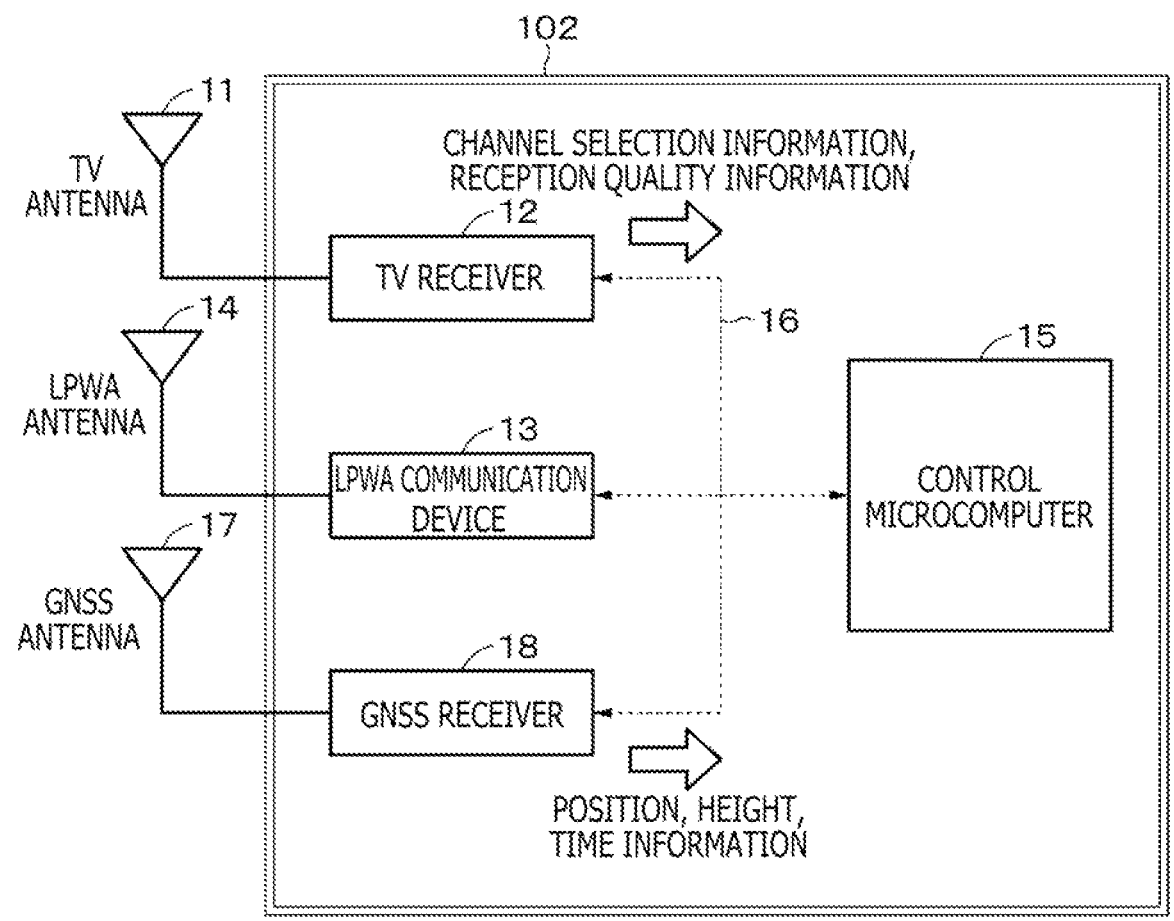
FIG. 5 is a block diagram of a second example of the radio wave monitoring apparatus according to the present technology.

A radio wave monitoring apparatus 102 is described with reference to FIG. 5. The radio wave monitoring apparatus 102 includes a GNSS receiver 18 connected to a GNSS antenna 17. The GNSS (Global Navigation Satellite System) is a generic name of navigation satellite systems such as GPS, GLONASS, Galileo, quasi-zenith satellites (QZSS), and BeiDou so forth. For example, since operation of the quasi-zenith satellite system (Michibiki) has been started recently, it supplements the GPS and is making higher accuracy positioning possible. It is to be noted that, in a case where the LPWA communication device 13 has a GNSS receiver incorporated therein, the function of the GNSS receiver is utilized.

Positioning information (position, height, and time information) from the GNSS receiver 18 is supplied to the control microcomputer 15 through the bus 16. The control microcomputer 15 adds the positioning information obtained from the GNSS receiver 18 to reception quality information obtained as a result of reception via the television antenna 11 and transmits resulting information from the LPWA communication device 13 and the LPWA antenna 14 to the transmission station or the data server. The transmission station or the data server can associate the reception quality information with the position information. Accordingly, the necessity to install the radio wave monitoring apparatus 102 at a fixed (prescribed) position is eliminated, and dynamic monitoring can be performed. Further, the transmission station or data server side can combine the position, the height, and the time information with the reception quality to perform mapping of the reception quality on a map. Since a radio wave is easier to be received by an antenna that is placed at a higher location, the height information is very significant information.

Figure 6:
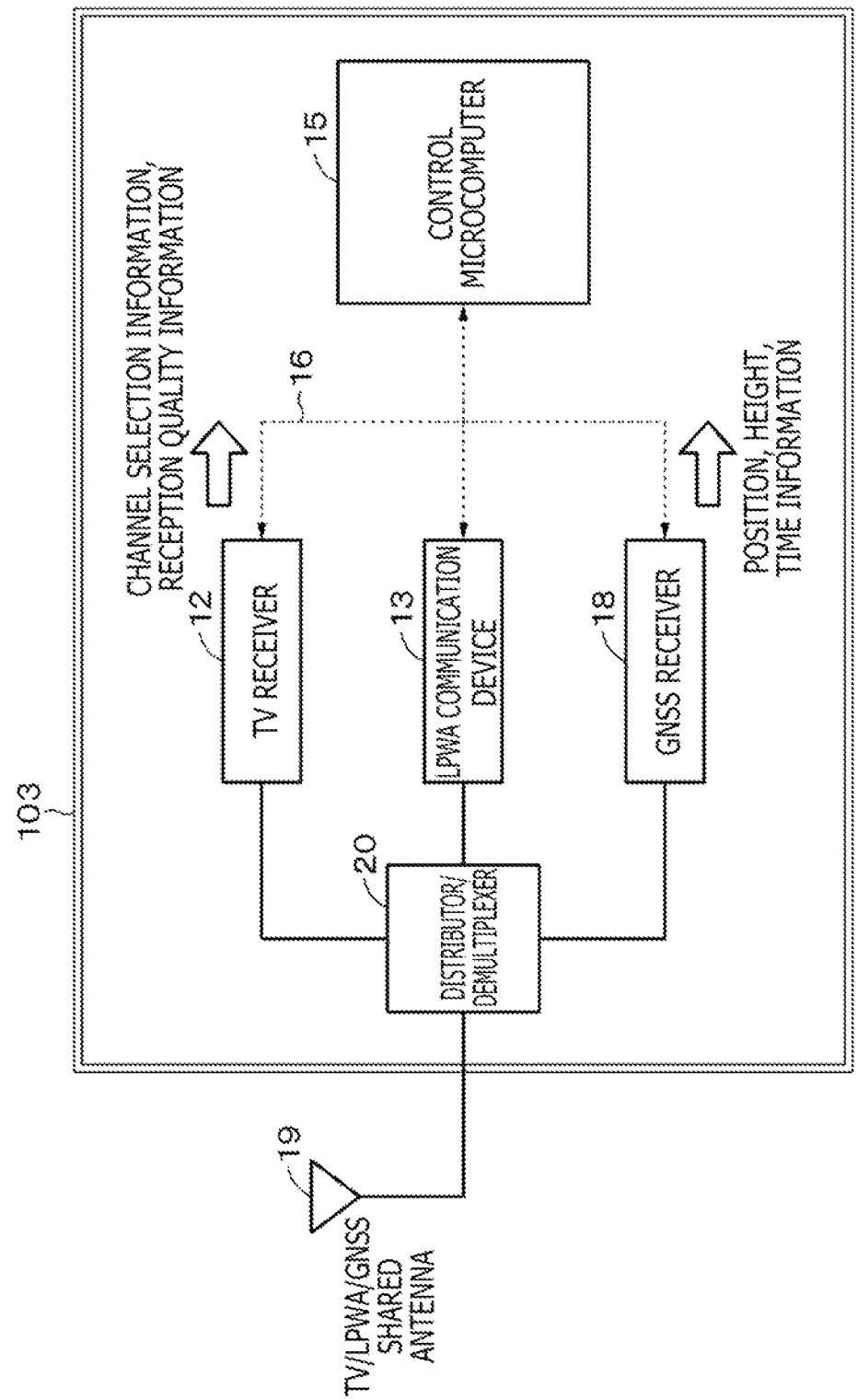
FIG. 6 is a block diagram of a third example of the radio wave monitoring apparatus according to the present technology.

If a plurality of antennae is available, then there is the possibility that the antennae may interfere with each other and there is the possibility that this may provide a restriction to the arrangement. Also, there is a problem that the arrangement becomes cumbersome. In order to solve such problems as described, a radio wave monitoring apparatus 103 depicted in FIG. 6 has such a configuration that a shared antenna 19 has the functions of the television antenna 11, the LPWA antenna 14, and the GNSS antenna 17 in the radio wave monitoring apparatus 102 described hereinabove. An output of the shared antenna 19 is supplied to a distributor/demultiplexer 20. The output of the shared antenna 19 is demultiplexed into a television reception signal, an LPWA reception signal, and a GNSS reception signal by the distributor/demultiplexer 20. The television reception signal is supplied to the television receiver 12, the LPWA reception signal is supplied to the LPWA communication device 13, and the GNSS reception signal is supplied to the GNSS receiver 18.

Further, in order to solve the problems of cell change and charging of a radio wave monitoring apparatus, a shared antenna 21 with which a solar cell is combined may be used as depicted in FIG. 7. This is because, since the place at which the shared antenna 21 is to be placed is in most cases a place at which the visibility is good, the possibility is high that the shared antenna 21 may be easy to get the sunlight at the place. According to this configuration, the problems relating to power supply can be solved.

Further, if a device capable of detecting a direction such as a gyro sensor is provided on the antenna, then it is possible to detect the direction of the antenna and transmit the direction of the antenna together with reception quality information. Consequently, when the reception quality becomes worse, it can also be detected whether or not the reception quality is deteriorated by a cause that the direction of the antenna is changed by an influence of strong wind or the like. Therefore, the accuracy in radio wave monitoring can be increased further.

Figure 8:
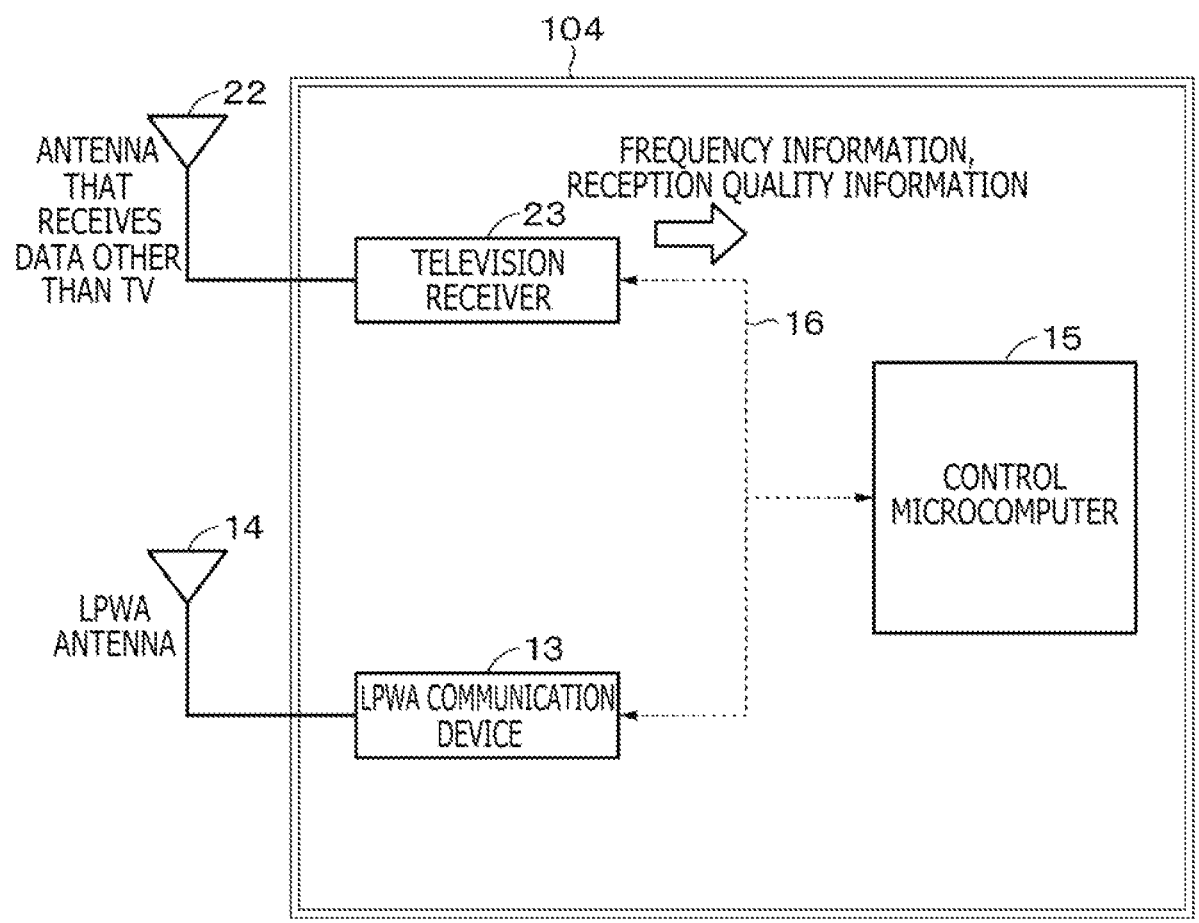
FIG. 8 is a block diagram of a fourth example of the radio wave monitoring apparatus according to the present technology.

A radio wave monitoring apparatus 104 depicted in FIG. 8 includes an antenna 22 that can receive radio waves other than television radio waves existing within a frequency range to be monitored. An output of the antenna 22 is supplied to a television receiver 23, and the television receiver 23 acquires information of the RSSI or the like as reception quality information. In particular, since the television receiver 23 can select a frequency channel over a wide frequency band, it is possible to detect not only not only reception quality of a digital television broadcast, but also signals of other wireless standards, for example, by selection of a desired frequency to acquire information of the RSSI or the like, so that an illegal radio wave, whether or not radio wave interference due to unnecessary radiation or the like exists, and the like can be detected. For example, depending on whether or not a radio wave can be demodulated by a demodulation section of the television receiver 23, it can be discriminated whether the radio wave is a television signal or some other signal.

Figure 9:
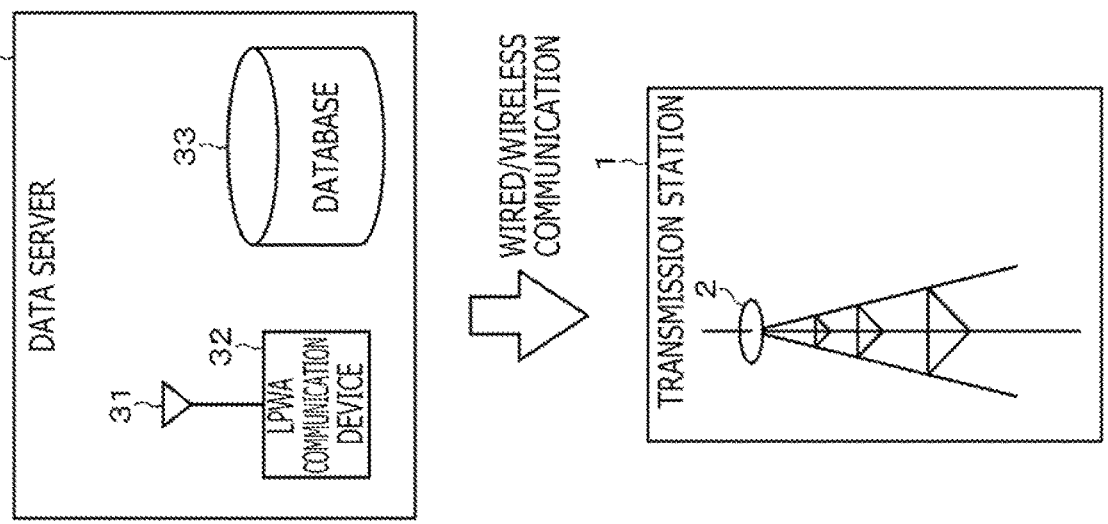
FIG. 9 is a block diagram used for explanation of an application example of the present technology.

In the radio wave monitoring system described above with reference to FIG. 2, reception quality information of the radio wave monitoring apparatus 100 is transmitted to the data server 30 by the LPWA communication. However, the radio wave monitoring apparatus 100 itself may include the data server 30. As depicted in FIG. 9, not the LPWA communication but wireless/wired communication or the like is used to transmit reception quality information to the transmission station 1 via the data server 30, so that the transmission power and a transmission parameter are changed dynamically on the basis of the reception quality information. For example, by changing the transmission level and a transmission parameter (for example, code rate), for example, depending on a weather condition, it is possible to achieve improvement in broadcasting network quality and cost reduction.

Also, as for reception quality information, it is possible to change reception settings of the television receiver according to a reception state by a fixed television reception station 34 by wireless/wired communication or the like. An example of the change of the reception settings is to remove a booster or a repeater. Further, the reception settings in the tuner of the television receiver may be changed. The directivity of the television antenna may be changed. For example, the directivity to a direction in which a high RSSI is detected by a radio wave monitoring apparatus is strengthened or the like on the basis of information obtained from the radio wave monitoring apparatus. As the method for changing the directivity, the direction of the antenna may be changed physically, or an adaptive array technology or a reflector may be used.

Also, in order to improve the reception quality in a mobile television reception station, it is possible to switch, in a case where the same content is being transmitted by another channel, the channel to a channel that is easier to receive, on the basis of the quality information obtained from a radio wave monitoring device installed nearby. Further, by changing a parameter on the broadcasting station side, it is possible to enhance the quality of a video signal or conversely, change to a parameter with which it is easier to perform reception. It is to be noted that, since the LPWA communication is compatible with high speed mobile communication, the radio wave monitoring apparatus may be installed on a mobile body. By this, quality information at a greater number of locations can be obtained, and a speed of movement may be calculated on the basis of position and time information obtained by the GNSS and used to search for reception settings suitable for the speed of movement or the location. This is because a signal to be received by the television receiver changes, depending on the position or the speed of movement. Further, in in-vehicle use or the like, a plurality of antennae is sometimes arranged on the front, rear, left, and right of a vehicle so as to perform diversity reception. However, detecting the antenna having the highest level or the like among the arranged antennae makes it possible to add information indicating a direction having the highest field intensity or the like as quality information as well.

Figure 10:
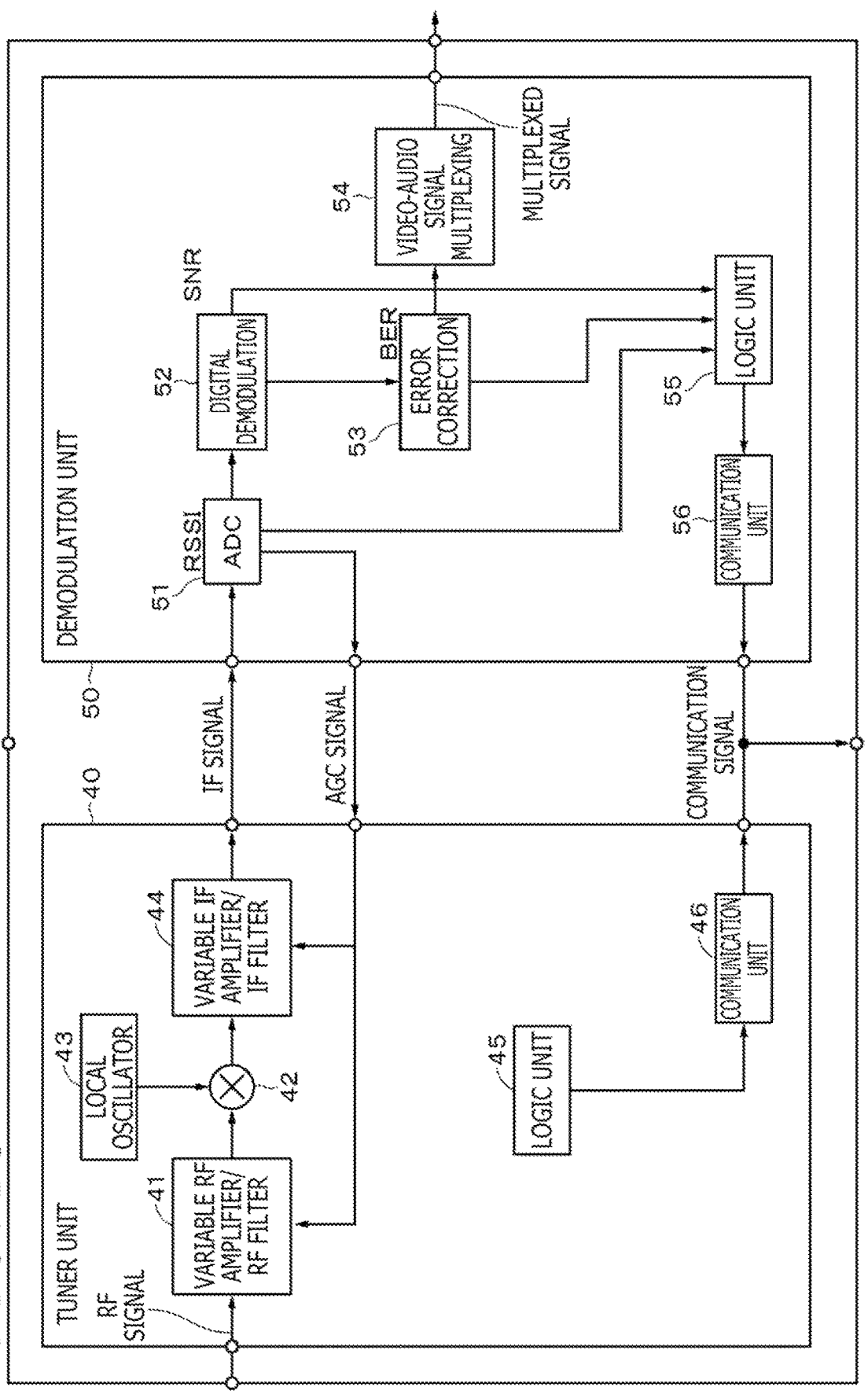
FIG. 10 is a block diagram of an example of a television receiver that can be used in the present technology.

In the present technology, it is very significant to achieve lower power consumption. A configuration (method) for this is described below. As depicted in FIG. 10, the television receiver 12 includes a tuner unit (or tuner IC) 40 that selects a channel and a digital demodulation unit 50 (or a demodulation IC) 50 that demodulates a digital signal on the channel. Since unnecessary blocking to radio wave monitoring does not occur, the power consumption can be reduced.

In the tuner unit 40, an RF signal supplied from the television antenna is amplified by a variable RF amplifier/RF filter 41 and supplied to a mixer 42. A local oscillation signal is supplied from a local oscillator 43 to the mixer 42 and is converted into a signal of an IF frequency by the mixer 42. An output signal of the mixer 42 is supplied to a variable IF amplifier/IF filter 44, and an IF signal is extracted from the variable IF amplifier/IF filter 44, and the IF signal is supplied to the demodulation unit 50.

In the demodulation unit 50, the inputted IF signal is converted into a digital signal by an A/D converter 51 and is subjected to demodulation of OFDM (Orthogonal Frequency Division Multiplex), QAM (Quadrature Amplitude Modulation), or the like by a digital demodulation unit 52. Thereafter, the IF signal is subjected to such an error correction process as LDPC (Low Density Parity check Code) or RS (Reed-Solomon) by an error correction unit 53. An output of the error correction unit 53 is supplied to a video-audio signal multiplexing unit 54, and a multiplexed signal (TS (Transport Stream), TLV (Type Length Value) or the like) is outputted from the video-audio signal multiplexing unit 54.

The A/D converter 51 of the demodulation unit 50 forms an AGC (Automatic Gain Control) signal, and the AGC signal is supplied as a gain control signal to the variable RF amplifier/RF filter 41 and the variable IF amplifier/IF filter 44 of the tuner unit 40. Further, the tuner unit 40 includes a logic unit 45 for control and a communication unit 46. Similarly, the demodulation unit 50 includes a logic unit 55 for control and a communication unit 56. Data from the communication unit 46 and the communication unit 56 are outputted to the control microcomputer and the LPWA communication device.

The tuner unit 40 and the demodulation unit 50 described above include circuit blocks necessary for ordinary television broadcast reception. However, in order to achieve such a function as a radio wave monitoring apparatus as in the present technology, some of such circuit blocks generate redundant signals, and for the object of reduction of the power consumption, it is desirable to put such circuit blocks into an operation stopped state. It is to be noted that the RSSI as the reception quality information is generated by the A/D converter 51, the SNR is generated by the digital demodulation unit 52, and the BER is generated by the error correction unit 53. These pieces of reception quality information are transmitted to the control microcomputer via the logic unit 55 and the communication unit 56.

Figure 11:
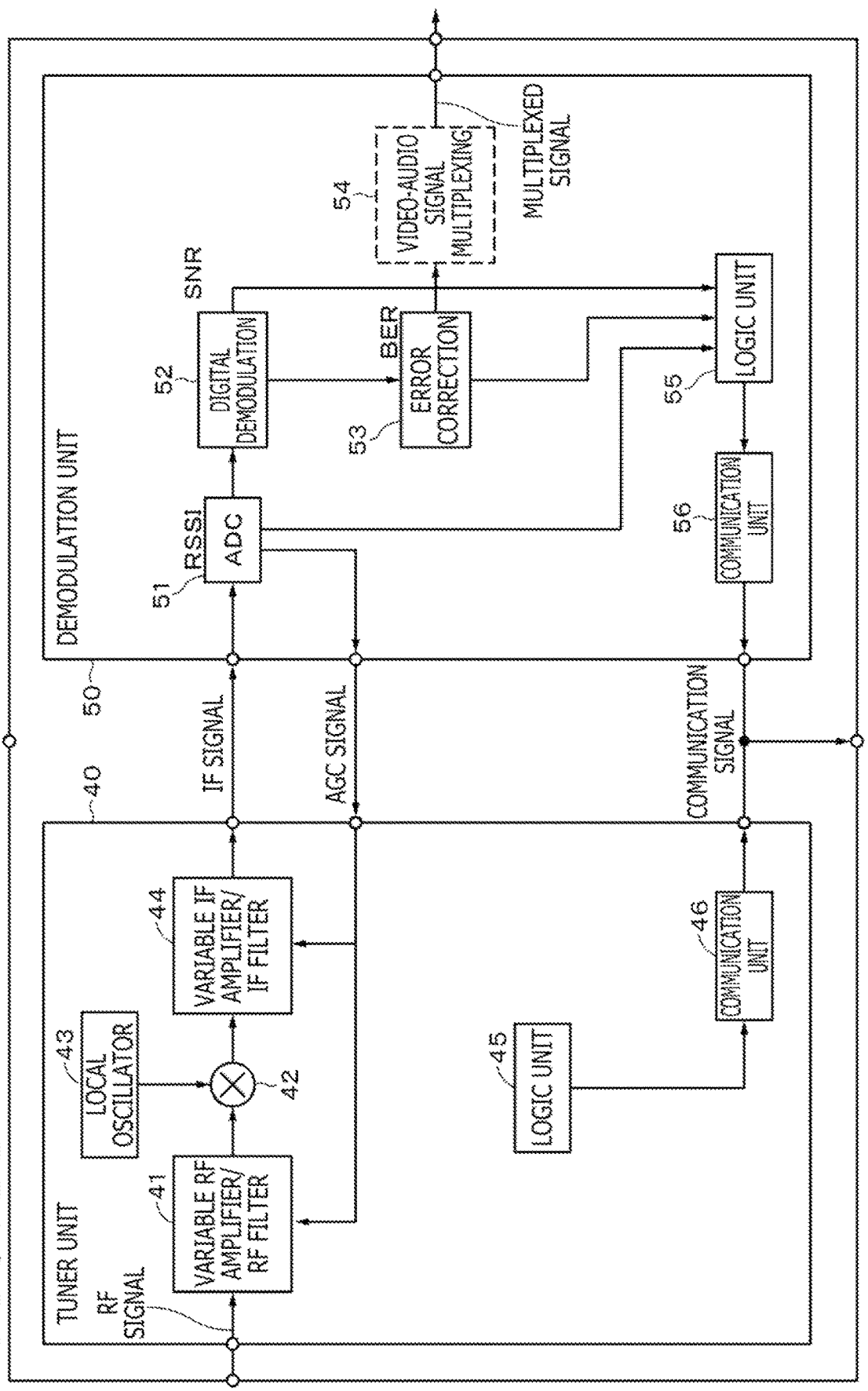
FIG. 11 is a block diagram of a first example of a television receiver that decreases the power consumption.

Since the radio wave monitoring apparatus need not output a multiplexed signal of video and audio, the video-audio signal multiplexing unit 54 is put into an operation stopped state as indicated by a broken line in FIG. 11. As a result, the power consumption can be reduced. It is to be noted that, although the control signal for operation stopping is not depicted, it is supplied from the control microcomputer to a target circuit block.

Figure 12:
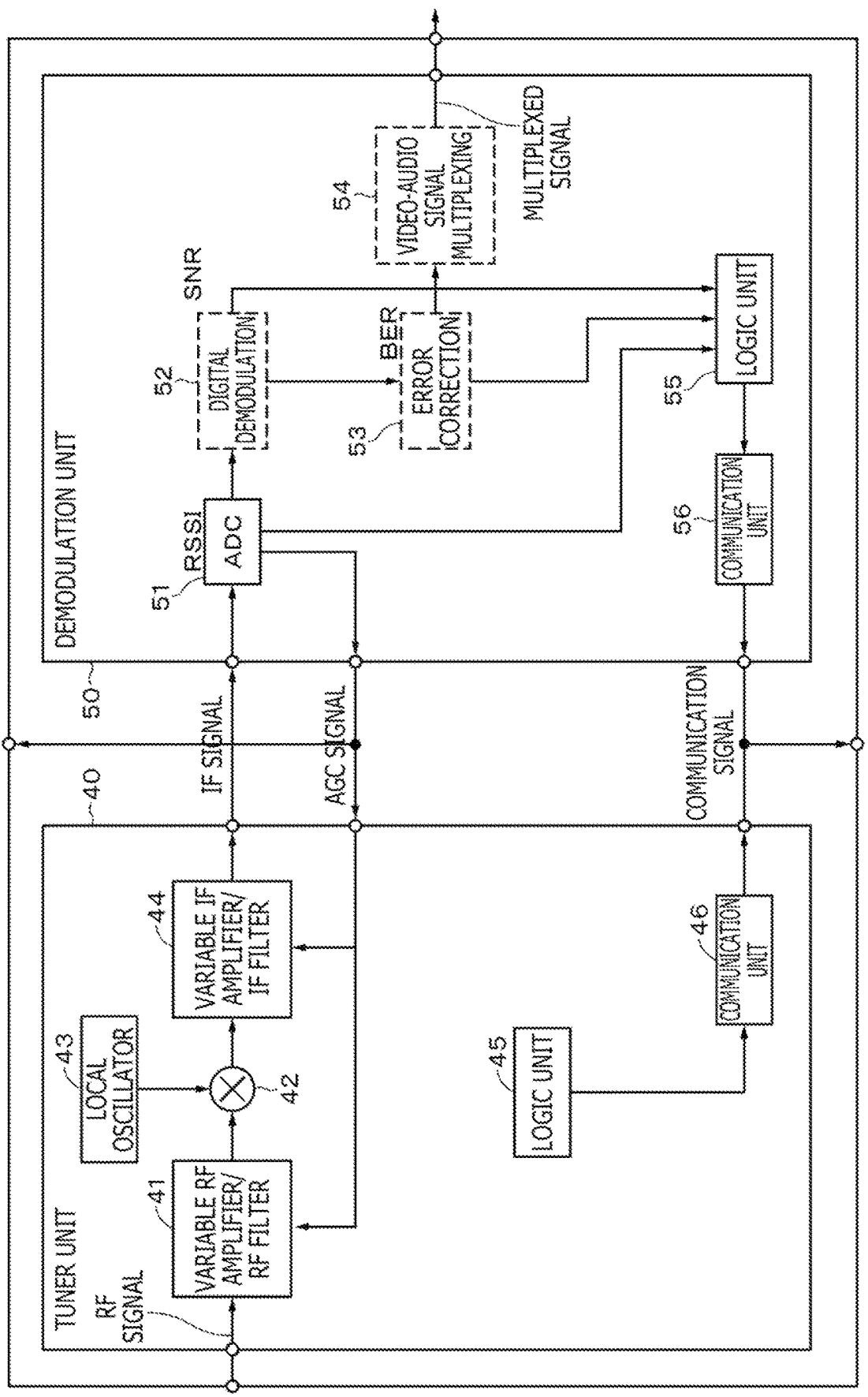
FIG. 12 is a block diagram of a second example of a television receiver that decreases power consumption.

In FIG. 12, as indicated by broken lines, the digital demodulation unit 52 and the error correction unit 53 in addition to the video-audio signal multiplexing unit 54 are put into an operation stopped state. As a result, the power consumption can be reduced further. Moreover, the digital demodulation unit 52 and the error correction unit 53 may be rendered operative only when the signal to be inputted to the demodulation unit 50 or the tuner unit 40 indicates a great change (namely, when an abnormality occurs). For example, only when the value of the RSSI of the demodulation unit 50 indicates a change of a fixed value or more, the digital demodulation unit 52 and the error correction unit 53 may be rendered operative to acquire values of the SNR and the BER. Further, the AGC voltage is adjusted according to the level inputted to the demodulation unit 50. This AGC voltage may be monitored by the control microcomputer, so that, only when it indicates a change, the digital demodulation unit 52 and the error correction unit 53 may be rendered operative.

Figure 13:
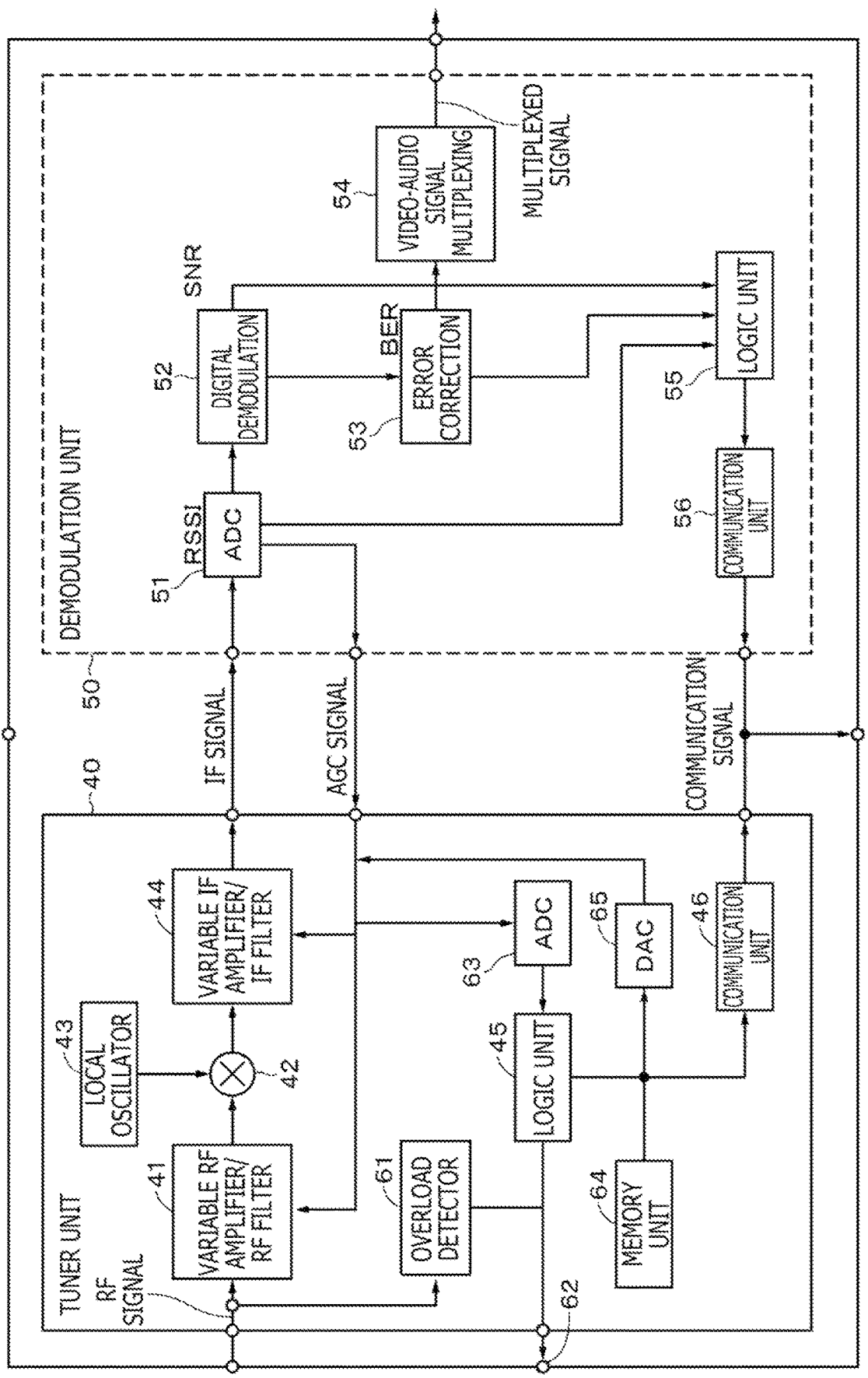
FIG. 13 is a block diagram of a third example of a television receiver that decreases the power consumption.

For further reduction of the power consumption, a technique of stopping the entire demodulation unit 50 and capturing a signal level of a certain degree only with use of the tuner unit 40 may be used. For example, as depicted in FIG. 13, the tuner unit 40 often includes an overload detector 61 that restricts the gain of an amplifier in a case where a signal of a high level equal to or higher than a fixed value is inputted thereto. Therefore, the overload detector 61 is used as a simple signal level detector, and the detection level of the overload detector 61 is monitored. Only when the value of the detection level indicates a change, the demodulation unit 50 may be rendered operative to acquire reception quality information such as the RSSI, SNR, and BER. Since this configuration necessitates only operation of circuit blocks that are required for simple monitoring, the power consumption can be reduced.

In FIG. 13, the value of the detection level is outputted as digital data from the logic unit 45 to the control microcomputer via the communication unit 46. Further, the voltage of the overload detector 61 may be outputted from a terminal 62, and this voltage may be inputted to an A/D conversion port of the control microcomputer so as to be monitored by the control microcomputer. At this time, the AGC voltage when the demodulation is operative is fetched by an A/D converter 63 and retained as digital data into a memory unit 64 in the inside of the tuner unit 40 (or into an external memory) such that, when the operation of the demodulation unit 50 is stopped, the voltage data retained in the memory unit 64 is applied to the variable RF amplifier/RF filter 41 and the variable IF amplifier/IF filter 44 by use of a D/A converter 65. As a result, the tuner unit 40 can operate in a state same as that when the demodulation operates.

Figure 14:
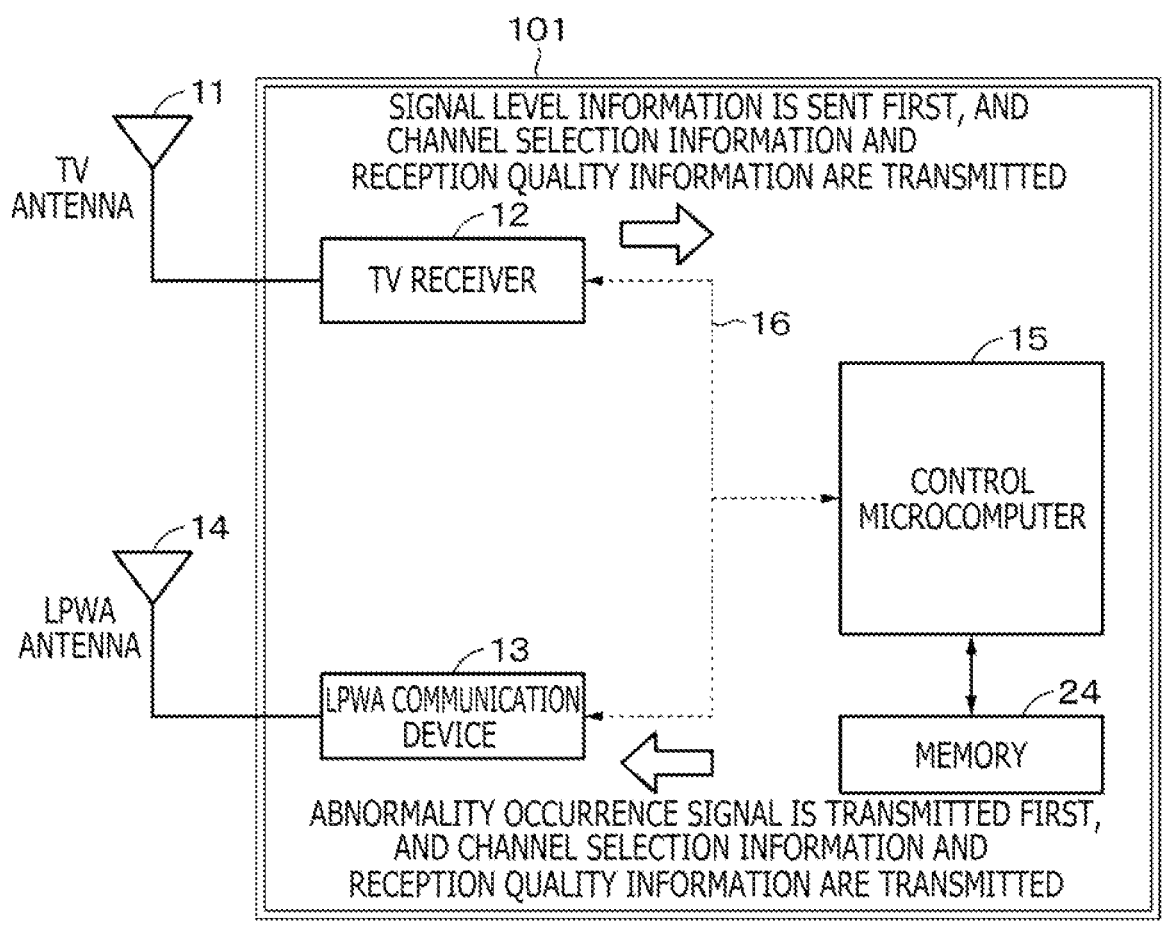
FIG. 14 is a block diagram illustrating processing of a radio wave monitoring apparatus.

As depicted in FIG. 14, for example, when an abnormality is detected, it is also possible to transmit the detected abnormality to the control microcomputer 15 of the radio wave monitoring apparatus 101 first, transmit an abnormality signal from the LPWA communication device 13, and then select, in order to analyze the abnormality in detail, all channels one by one to analyze the substance of the abnormality. If a memory is provided in the control microcomputer 15, a result of the analysis is stored into a memory 24 such that, when a maintenance worker arrives at the site in response to reception of the abnormality transmission signal, the maintenance worker can immediately refer to the data.

Although the embodiments of the present technology have been described particularly, the present technology is not limited to the embodiments described above, and various modifications based on the technical idea of the present technology are possible. In addition, in regard to the forms of modifications, an optionally selected one or plural ones of them can be combined suitably. Moreover, the configurations, methods, processes, shapes, materials, numerical values, and the like in the embodiments described above can be combined with each other without departing from the subject matter of the present technology. For example, since an LPWA communication device can communicate even during movement at a high speed, the radio wave monitoring apparatus may be incorporated in a mobile body such that the reception quality is monitored continuously.

It is to be noted that the present technology can also have such configurations as described below.

(1)

A radio wave monitoring apparatus including:
  a television receiver which is capable of receiving a radio wave in a television broadcast frequency band and generates reception quality information; and
  a wireless communication device which is capable of establishing communication in an area to be monitored and a wider area than the area to be monitored and transmits the reception quality information.

(2)

The radio wave monitoring apparatus according to (1), in which
  the radio wave in the television broadcast frequency band includes a radio wave other than a television signal.

(3)

The radio wave monitoring apparatus according to (1) or (2), in which
  the wireless communication device includes an LPWA communication device.

(4)

The radio wave monitoring apparatus according to any one of (1) to (3), in which
  the wireless communication device transmits the reception quality information to a transmission station.

(5)

The radio wave monitoring apparatus according to any one of (1) to (4), in which
  the wireless communication device sends the reception quality information to a server so as to store the reception quality information in the server.

(6)

The radio wave monitoring apparatus according to any one of (1) to (5), further including:
  a GNSS receiver, in which
  a position and a height obtained by the GNSS receiver are transmitted by the wireless communication device.

(7)

The radio wave monitoring apparatus according to any one of (1) to (6), further including:
  a GNSS receiver, in which
  time information by the GNSS receiver is transmitted by the wireless communication device.

(8)

The radio wave monitoring apparatus according to any one of (1) to (7), in which
  the radio wave monitoring apparatus includes an antenna.

(9)
The radio wave monitoring apparatus according to (8), in which
the radio wave monitoring apparatus includes a television antenna and an LPWA antenna.

(10)
The radio wave monitoring apparatus according to (8), in which
the radio wave monitoring apparatus includes a television antenna, an LPWA antenna, and a GNSS antenna.

(11)
The radio wave monitoring apparatus according to (8), in which
the radio wave monitoring apparatus includes a single antenna capable of being used for a plurality of purposes.

(12)
The radio wave monitoring apparatus according to (8), in which
the radio wave monitoring apparatus includes a combination of a solar cell and the antenna.

(13)
The radio wave monitoring apparatus according to any one of (1) to (12), in which
operation of a circuit block that is redundant to radio wave monitoring in the television receiver is stopped.

(14)
The radio wave monitoring apparatus according to (13), in which
only when an input signal indicates a great change, the circuit block is rendered operative to acquire the reception quality information.

(15)
The radio wave monitoring apparatus according to (14), in which
an AGC signal is monitored, and when the AGC signal changes by an amount equal to or greater than a predetermined value, the reception quality information is acquired.

REFERENCE SIGNS LIST

1: Transmission station
4, 13: LPWA communication device
12: Television receiver
15: Control microcomputer
18: GNSS receiver
30: Data server
40: Tuner unit
50: Demodulation unit
100, 101, 102, 103, 104: Radio wave monitoring apparatus

The invention claimed is:

1. A radio wave monitoring apparatus comprising:
a television receiver which is capable of receiving a radio wave in a television broadcast frequency band and generates reception quality information; and
a wireless communication device which is capable of establishing communication in an area to be monitored and a wider area than the area to be monitored and transmits the reception quality information, wherein
operation of a circuit block that is redundant to radio wave monitoring in the television receiver is stopped,
only when an input signal indicates a great change, the circuit block is rendered operative to acquire the reception quality information, and
an AGC signal is monitored, and when the AGC signal changes by an amount equal to or greater than a predetermined value, the reception quality information is acquired.

2. The radio wave monitoring apparatus according to claim 1, wherein
the radio wave in the television broadcast frequency band includes a radio wave other than a television signal.

3. The radio wave monitoring apparatus according to claim 1, wherein
the wireless communication device includes an LPWA communication device.

4. The radio wave monitoring apparatus according to claim 1, wherein
the wireless communication device transmits the reception quality information to a transmission station.

5. The radio wave monitoring apparatus according to claim 1, wherein
the wireless communication device sends the reception quality information to a server so as to store the reception quality information in the server.

6. The radio wave monitoring apparatus according to claim 1, further comprising:
a GNSS receiver, wherein
a position and a height obtained by the GNSS receiver are transmitted by the wireless communication device.

7. The radio wave monitoring apparatus according to claim 1, further comprising:
a GNSS receiver, wherein
time information by the GNSS receiver is transmitted by the wireless communication device.

8. The radio wave monitoring apparatus according to claim 1, wherein
the radio wave monitoring apparatus includes an antenna.

9. The radio wave monitoring apparatus according to claim 8, wherein
the radio wave monitoring apparatus includes a television antenna and an LPWA antenna.

10. The radio wave monitoring apparatus according to claim 8, wherein
the radio wave monitoring apparatus includes a television antenna, an LPWA antenna, and a GNSS antenna.

11. The radio wave monitoring apparatus according to claim 8, wherein
the radio wave monitoring apparatus includes a single antenna capable of being used for a plurality of purposes.

12. The radio wave monitoring apparatus according to claim 8, wherein
the radio wave monitoring apparatus includes a combination of a solar cell and the antenna.

13. The radio wave monitoring apparatus according to claim 1, wherein
the circuit block includes a video-audio signal multiplexing unit.

14. The radio wave monitoring apparatus according to claim 1, wherein
the circuit block includes a digital demodulation unit.

15. The radio wave monitoring apparatus according to claim 1, wherein
the circuit block includes an error correction unit.

16. The radio wave monitoring apparatus according to claim 1, wherein
the circuit block includes an entire demodulation unit.

17. The radio wave monitoring apparatus according to claim 16, wherein the entire demodulation unit includes an ADC, a digital demodulation unit, an error correction unit, a video-audio signal multiplexing unit, a logic unit, and a communication unit.

18. The radio wave monitoring apparatus according to claim 1, wherein
the reception quality information includes at least an RSSI, an SNR, and a BER.

* * * * *